(12) United States Patent
Nakatsuka et al.

(10) Patent No.: US 6,585,149 B2
(45) Date of Patent: Jul. 1, 2003

(54) PACKAGING METHOD USING LEAD-FREE SOLDER

(75) Inventors: Tetsuya Nakatsuka, Yokohama (JP); Masahide Okamoto, Yokohama (JP); Tomoyuki Ohmura, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/929,215

(22) Filed: Aug. 13, 2001

(65) Prior Publication Data

US 2003/0034381 A1 Feb. 20, 2003

(51) Int. Cl.⁷ .............................. B23K 1/08; B23K 31/02
(52) U.S. Cl. ..................... 228/180.1; 228/260; 228/222; 228/37; 228/46
(58) Field of Search ............................... 228/123.1, 260, 228/261, 222, 234.1, 229, 230, 37, 46, 200

(56) References Cited

U.S. PATENT DOCUMENTS

| 5,874,043 A | * | 2/1999 | Sarkhel et al. ............... 420/557 |
| 6,010,060 A | * | 1/2000 | Sarkhel et al. ............ 228/179.1 |
| 6,116,497 A | * | 9/2000 | Scheel et al. ............. 228/234.2 |
| 6,364,195 B1 | * | 4/2002 | Masuda et al. ................ 228/37 |

FOREIGN PATENT DOCUMENTS

| JP | 1-161891 | * | 6/1989 |
| JP | 5-185209 | * | 7/1993 |
| JP | 10-166178 | | 6/1998 |
| JP | 11-179586 | | 7/1999 |
| JP | 11-221694 | | 8/1999 |
| JP | 11-354919 | | 12/1999 |
| JP | 2001-036233 | | 2/2001 |
| JP | 2001-168519 | | 6/2001 |
| JP | 2001-298267 | * | 10/2001 |

* cited by examiner

*Primary Examiner*—M. Alexandra Elve
*Assistant Examiner*—Len Tran
(74) *Attorney, Agent, or Firm*—Townsend and Townsend and Crew LLP

(57) ABSTRACT

A packaging method using lead-free solder, characterized by including a reflow-soldering step in which a surface mount device is soldered to a circuit board with a lead-free solder paste; an inserting step in which the lead or terminal of a insertion mount device is inserted into the circuit board; a step in which a warp preventing jig is attached to the circuit board; a flux applying step in which flux is applied to the foregoing circuit board; a preheating step in which, after applying flux, the lower surface of the circuit board is preheated; a flow-soldering step in which the upper surface of the circuit board the lower surface of which was preheated in the preheating step is heated, and by applying lead-free solder paste to the lower surface of the circuit board, the lead or terminal of the insertion mount device is flow-soldered to the circuit board; and a temperature controlling step where temperatures of both surfaces of a circuit board are adjusted, the upper surface of the circuit board is cooled or heated and the lower surface of the circuit board is cooled, immediately after soldering in the flow-soldering step.

17 Claims, 5 Drawing Sheets

PACKAGING METHOD USING LEAD-FREE SOLDER

BACKGROUND OF THE INVENTION

This invention relates to a packaging method using lead-free solder alloy metal the toxicity of which is minor, a soldering system, and a mounting structure in which the packaging method and soldering system are used. This lead-free solder alloy metal can be applied to connect an electronic device to a circuit board of an organic board and the like, and is used as a substitution of Sn-37Pb (Unit: Mass %) which is used for a soldering at about 220° C.

A conventional method to solder a device to a circuit board made of an organic material and the like of electric appliances comprises a reflow-soldering step in which hot air is blown against the circuit board, solder paste printed on electrodes is molten, and thus, a surface mount device is soldered, and a flow-soldering step in which a molten solder jet is caused to come into contact with a circuit board, and thus, some surface mount devices such as a insertion mount device, a chip device and the like are soldered.

And, this soldering method is called a packaging method.

Now, it has been requested to use lead-free solder alloy metal the toxicity of which is minor for both the solder paste used in the reflow-soldering step and the molten solder jet used in the flow-solder step.

As the prior arts related to this packaging method using lead-free solder, Japanese Patent Laid-open No. 10-166178 (Prior Art 1), No. 11-179586 (Prior Art 2), No. 11-221694 (Prior Art 3), No. 11-354919 (Prior Art 4), No. 2001-168519 (Prior Art 5), and No. 2001-36233 (Prior Art 6) and the like have been known.

In the prior art 1, for the lead-free solder, Sn—Ag—Bi system based solder or Sn—Ag—Bi—Cu based solder alloy metal is mentioned. In the prior art 2, it is mentioned that solder of Sn—Ag—Bi system which leads as a lead-free solder is connected to an electrode the surface of which is treated with a layer of Sn—Bi system. In the prior art 3, it is mentioned that electronic devices are reflow-soldered to both the 1st and 2nd surfaces of an organic board with lead-free solder which contains Sn as the main component, 0 to 65 mass % of Bi, 0.5 to 4.0 mass % of Ag, and total 0 to 3.0 mass % of Cu and/or In. In the prior art 4, it is mentioned that solder is cooled under an about 10 to 20° C./s cooling velocity in a method by which electronic devices are connected to a circuit board with Bi containing lead-free solder. In the prior art 5, it is mentioned that, in a method by which an electronic device is surface connected and mounted on surface A of a board by means of a reflow-soldering, and then a lead of the electronic device inserted from the surface A side is flow-soldered on surface B of the board, the solder used for the reflow-soldering in the surface A side is a lead-free solder of such a composition as Sn (1.5 to 3.5 wt %), Ag (0.2 to 0.8 wt %), Cu (0 to 4 wt %), and In (0 to 2 wt %), and the solder used for the flow-soldering in the surface B is a lead-free solder of such a composition as Sn (0 to 3.5 wt %), Ag (0.2 to 0.8 wt %), and Cu. In the prior art 6, it is mentioned that, when flow-soldering by using a lead-free solder of an eutectic crystal composition the melting point of which is higher than that of a conventionally used Sn-37Pb, it is so intended that a temperature difference between an organic board and an electronic device main body will not increase while cooling the board after flow-soldering by using a heat conducting material in a space between a device main body and a board.

In this packaging method, as mentioned in the prior Art 6, in case of a flow-soldering in which molten solder jet was caused to come into contact with the lower surface of a circuit board, a case in which soldering was made under a temperature higher than that of a conventional method by using a lead-free solder of an eutectic crystal composition with a higher melting point than 183° C. melting point of the Sn-37Pb (Unit: Mass %) or using a lead-free solder of a similar composition was considered.

However, the following points were not taken into considerations in anyone of the above-described prior arts 1 through 6.

In a packaging method, when preheating was made rapidly to shorten circuit board soldering time, or when a large volume of a component such as Pb which caused solder composition in a connected portion after the connection to considerably deviate from the eutectic crystal composition was contained in plating of an electrode, there was a possibility to cause the following three types of faulty soldering.

First of all, when flow-soldering a insertion mount device to a circuit board, a phenomenon called "lift off" in which a solder in the insertion mount device connected position is peeled off from an electrode on the board due to a heat capacity difference of each insertion mount device occurs.

Secondary, the solder in an already connected surface mount device is molten again, causing the surface mount device to be peeled off.

Tertiary, because of a heat capacity of the already connected surface mount device, a component with a low melting point on the side near the board causes segregation in the solder in a connected portion when cooling the board after a flow-soldering, causing the reliability to drop down remarkably not only at the time of a connection by means of soldering but also after the connection.

Further, when conducting a rapid preheating to shorten circuit board soldering time, the above describing three types of faulty soldering are likely to occur.

Furthermore, in a conventional flow-soldering step, the soldering condition must be changed after all the flowing boards are carried out, and in particular, when manufacturing small batches of a variety of products, the loss of much time occurs.

SUMMARY OF THE INVENTION

It is an object of the present invention to provide a packaging method using lead-free solder capable of preventing a faulty soldering resulted from more and more uses of lead-free solder, and maintaining a high reliability of surface mount device connecting strength.

Another object of the present invention is to provide a packaging method using lead-free solder and flow-soldering system so as to reduce a loss of circuit board production time caused by producing small batches of a variety of products.

In order to accomplish the foregoing objects, the present invention is a packaging method using lead-free solder characterized by comprising a reflow-soldering step of soldering a surface mount device to an upper or lower surface of a circuit board with a lead-free solder paste; an inserting step of inserting a lead or terminal of a insertion mount device into a through hole drilled in the circuit board from an upper surface side of the circuit board; a flux applying step of applying flux to the circuit board after the lead or terminal of the insertion mount device is inserted into the through hole in the inserting step; a preheating step of preheating a lower surface of the circuit board after the flux is applied to the circuit board in the flux applying step; a flow-soldering step of cooling the upper surface of the circuit board the lower surface of which has been preheated in the preheating step, and flow-soldering the lead or terminal of the insertion mount device to the circuit board by applying lead-free solder jet to the lower surface of the circuit board; and a circuit board-double-side temperature control step of cooling or heating the upper surface of the circuit board, and cooling the lower surface of the circuit board, immediately after the soldering in the flow-soldering step.

Further, the present invention is a packaging method using lead-free solder characterized by comprising a reflow-soldering step of soldering a surface mount device to an upper or lower surface of a circuit board with a lead-free solder paste; an inserting step of inserting a lead or terminal of a insertion mount device into a through hole drilled in the circuit board from an upper surface side of the circuit board; a warp preventing jig attaching step of attaching a warp preventing jig made of metal such as aluminum or the like on the circuit board; a flux applying step of applying flux to the circuit board after the lead or terminal of the insertion mount device is inserted into the through hole in the inserting step; a preheating step of preheating a lower surface of the circuit board after the flux is applied to the circuit board in the flux applying step; a flow-soldering step of heating the upper surface of the circuit board the lower surface of which has been preheated in the preheating step, and flow-soldering the lead or terminal of the insertion mount device to the circuit board by applying lead-free solder jet to the lower surface of the circuit board; and a circuit board-double-side temperature control step of cooling or heating the upper surface of the circuit board, and cooling the lower surface of the circuit board, immediately after the soldering in the flow-soldering step.

Further, in the packaging method using lead-free solder, the present invention is characterized by further including a step in which a cover is attached to the portion where the surface mount device has already been attached to the lower surface of the circuit board as an additional step before the foregoing flux applying step.

Further, in the foregoing packaging method using lead-free solder, the present invention characterized in that the composition of the lead-free solder used in the foregoing flow-soldering step is an eutectic crystal composition or an equivalent eutectic crystal composition of an Sn—Cu system, Sn—Ag system, Sn—Zn system, Sn—Ag—Cu system, Sn—Ag—Bi system or Sn—Zu—Bi system. In particular, Sn-3Ag-xBi –0.5Cu ($0 \leq x \leq 4$, Unit: Mass %) is an eutectic crystal composition or a composition similar to the eutectic crystal composition of Sn—Ag—Cu system, in addition, has a melting point higher than the melting point (183° C.) of the conventional Sn-37Pb, and can be used with a high connection reliability even under an extreme condition. Further, Sn-0.8Ag-57Bi is of an eutectic crystal composition or of a composition similar to eutectic crystal composition, and when used under a limited temperature, it can be used with a high connection reliability.

Further, the present invention is characterized in that the lead-free solder paste used in the foregoing reflow-soldering process is a solder alloy of an Sn—Cu system, Sn—Ag system, Sn—Zn system, Sn—Ag—Cu system, Sn—Zn—Cu system, Sn—Zn—Bi system or Sn—Ag—Bi system, desirably, Sn-(1~4)Ag-(0~8)Bi-(0~1)Cu (Unit: Mass %).

Further, the present invention is characterized in that, the cooling of the upper surface of the circuit board in the flow-soldering step performs by blowing a liquid such as nitrogen or the like having a temperature not more than 50° C. (desirably, in a temperature range of 20° C. to 50° C.).

Further, the present invention is characterized in that temperature of the lead-free solder jet applied to the lower surface of the circuit board in the flow-soldering step is within the range of 170° C. to 260° C.

Further, the present invention is characterized in, in the flow-soldering step, that the upper surface of the circuit board is heated to a temperature not more than 100° C. (desirably, in a temperature range of about 150° C. to about 200° C.).

Further, the present invention characterizes in that, the heating of the upper surface in the flow-soldering step performs by blowing nitrogen in the temperature not less than 100° C. The reason of that the temperature of the upper surface of the circuit board or the temperature of liquid such as nitrogen or the like using heating of the upper surface is not less than 100° C., is based on that minimum temperature being effected on controlling the segregation of a lower melting point phase being formed with combination of lead-free solder and plating of an electrode in a connected portion is 100° C.

Further, the present invention is a packaging structure (product) being characterized that is mounted a surface mount device and a insertion mount device on a circuit board by using the foregoing packaging method.

As described above, with the aforementioned composition, when preheating is made rapidly to shorten a circuit board soldering time in the case of that flow-soldering is made under a high temperature by using lead-free solder of an eutectic crystal composition or of a composition similar to the eutectic crystal composition the melting point of which is higher than 183° C., or when electrode plating or the like contains a considerable amount of components such as lead or the like which cause the solder composition of a connected part to deviate considerably from an eutectic crystal composition after the connection, it can be made hard to occur a lift-off of a insertion mount device connected part, a remelting of solder in the surface mount device connected part, and a peel off of the surface mount device caused by segregation of the low melting point component in the solder.

Furthermore, the present invention is a flow-soldering system characterized by including a forth conveyor route provided with a carry-in unit which carries in a subjective circuit board which has been reflow-soldered using lead-free solder paste; a flux applying unit which applies flux to the circuit board carried in by the carry-in unit; a preheating unit which preheats the lower surface of the circuit board after applying flux to the circuit board at the flux applying unit; a flow-soldering unit which cools down the upper surface of the circuit board the lower surface of which was preheated by the preheating unit, or heats the upper surface of the circuit board with a warp preventing jig attached to the circuit board, and flow-solders by applying lead-free solder jet to the lower surface of the circuit board, and an adjusting unit to adjust temperatures of both surfaces of the circuit board which cools or heats the upper surface of the circuit board and further cools the lower surface of the circuit board, immediately after the soldering at the flow-soldering unit; and a back conveyor route along which the flow-soldered circuit board is returned from the unit to adjust temperature of both surfaces of the circuit board to a position near the carry-in unit on the forth conveyor route.

Further, the present invention is a flow-soldering system characterized by including a carry-in unit which carries in a subjective circuit board which has been reflow-soldered using lead-free solder paste; a flux applying unit which applies flux to the circuit board carried in by the carry-in unit; a preheating unit which preheats the lower surface of the circuit board after applying flux to the circuit board at the flux applying unit; a flow-soldering unit which cools down the upper surface of the circuit board the lower surface of which was preheated by the preheating unit,,or heats the upper surface of the circuit board with a warp preventing jig attached to the circuit board, and flow-solders by applying lead-free solder jet to the lower surface of the circuit; and an adjusting unit to adjust temperatures of both surfaces of the board which cools or heats the upper surface of the circuit board and cools the lower surface of the circuit board, immediately after the soldering at the flow-soldering unit, wherein the circuit board moving route comprises so as to be back planarly or spatially to the carry-in unit by way of the carry-in unit, the flux applying unit, the preheating unit, the flow-soldering unit and the unit to adjust temperatures of both surfaces of the board.

Further, the present invention is characterized in that the preheating is made in the preheating unit of the flow-soldering system also under the condition in which the circuit board is caused to stop.

Further, the present invention is characterized that further comprises a control memory which stores stop-time data being stopped the circuit board on the preheating unit, and a control unit which controls so as to stop the circuit board on the preheating unit.

Further, the present invention is a flow-soldering system characterized by comprising a holder-carrying conveyor which carries a circuit board holder mounted a circuit board from the preheating unit to the adjusting unit via the flow-soldering unit, and a station which can stop the circuit board holder on both of an entrance and an exit of the holder-carrying conveyor, whereby the flow-soldering system is able to flow-solder continuously for circuit boards which differs an optimum conveyor speed and an optimum preheating time by setting an optimum conveyor speed for carrying the circuit board from starting the entrance of the holder-carrying conveyor to finishing flow-soldering for the circuit board, and by setting an optimum preheating time on the preheating unit.

Further, the present invention is able to decrease time when must be discontinued the production of the circuit board by changing condition of flow-soldering when manufacturing small batches of a variety of products on base of controlling independently each of the conveyors which separates carrying conveyors for carrying the circuit board into a portion of carrying conveyor being in relation with flow-soldering and a portion of carrying conveyor being in relation of applying flux and including other portion.

DETAILED DESCRIPTION OF THE PREFERRED EMBODIMENT

The preferred embodiment of the present invention will be described in detail.

Figure 1:
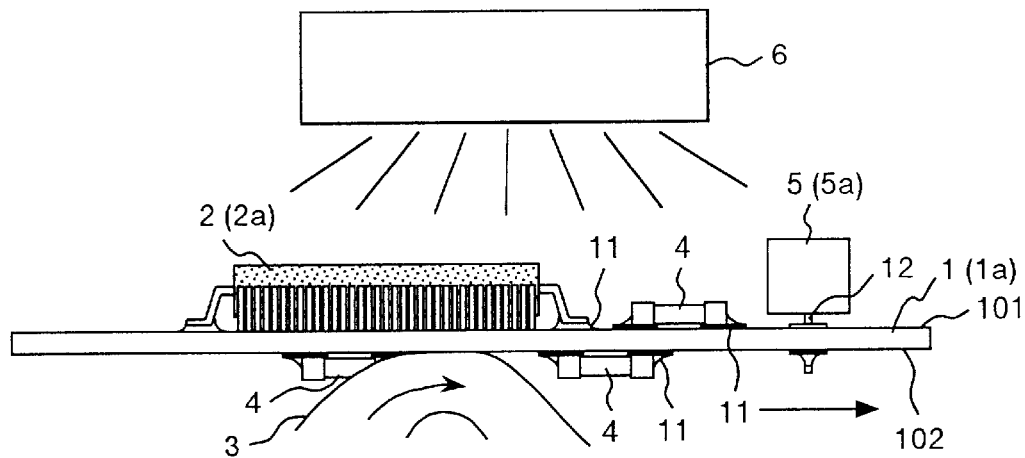
FIG. 1 is a diagram for explaining packaging methods using lead-free solder according to a first and third embodiments of the present invention.

In the present invention, as shown in FIG. 1, in a packaging method in which surface mount devices 2 and 4 are soldered on an upper surface 101 or lower surface 102 of a circuit board 1 with a lead-free solder paste 11, a lead 12 of a insertion mount device 5 is inserted into a through hole from the upper surface side of the circuit board 1, a cover (not shown) is attached, as required, on a portion of the lower surface 102 of the circuit board 1 where a surface mount device has already been soldered, flux is applied to the circuit board 1, and then, a flow-soldering is made from the lower surface 102 of the circuit board 1 with lead-free molten solder jet 3, in order to shorten a time required for a connection to the circuit board 1 in the flow-soldering, first of all, the lower surface 102 of the circuit board 1 is preheated with a preheating system 22 such as a sheath heater, flow-soldering is made with a lead-free molten solder jet 3 from the lower surface 102 of the circuit board 1 with the upper surface 101 of the circuit board 1 cooled with a board cooling system 6, and both the upper and lower surfaces of the circuit board 1 are cooled immediately after the soldering.

The board cooling system 6, for example, comprises a system that blows nitrogen in a temperature range of 20° C. to about 50° C. (a temperature close to room temperature 25° C.) and at a flow rate of 0.3 m$^3$/min. Further, both surfaces of the circuit board 1 are cooled immediately after the soldering with a temperature control unit 24 which adjusts temperatures of both surfaces of the circuit board by blowing nitrogen, for example, in a temperature range of 5° C. to about 20° C. (a temperature about 15° C. lower than room temperature 25° C.) and in individual flows (the lower surface of the board: about 0.3 m$^3$/min.; the upper surface of the board: about 0.1 m$^3$/min) for about one minute. A peel off in the connected portion of the surface mount devices 2 and 4 due to a remelting of the solder paste 11 can be prevented by making a flow-soldering with the upper surface 101 of the circuit board 1 cooled with the board cooling system 6.

Figure 2:
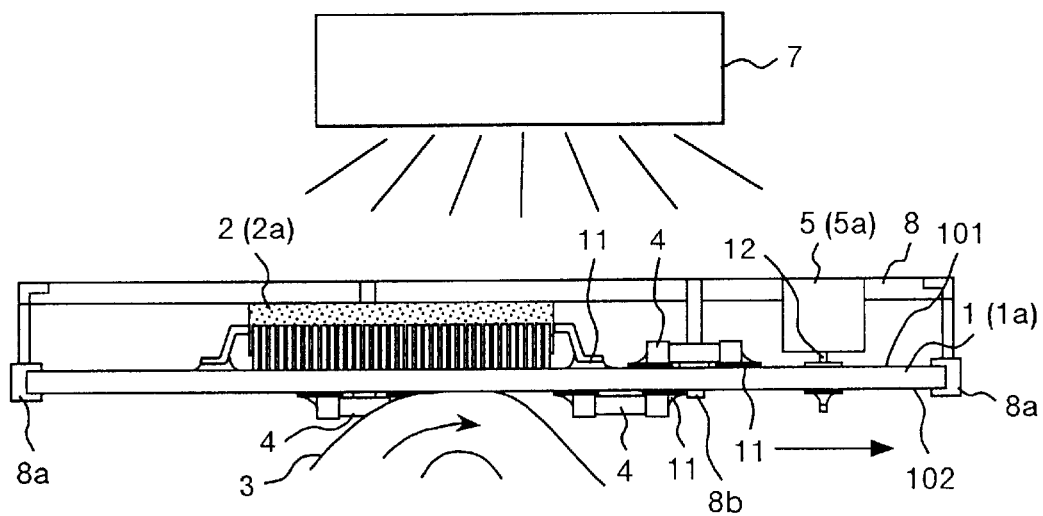
FIG. 2 is a diagram for explaining packaging methods using lead-free solder according to second and fourth embodiments of the present invention.

Further, in the present invention, as shown in FIG. 2, in the packaging method in which the surface mount devices 2 and 4 are soldered on the upper surface 101 or lower surface 102 of the circuit board 1 with lead-free solder paste 11, the lead 12 of the insertion mount device 5 is inserted into a through hole from the upper surface side of the circuit board 1, a cover (not shown) is attached, as required, on a portion of the lower surface 102 of the circuit board 1 where surface mount devices have already been soldered, flux is applied to the circuit board 1, and then, a flow-soldering is made from the lower surface 102 of the circuit board 1 with lead-free molten solder jet 3, a warp preventing jig 8 made of metal such as aluminum is mounted on the circuit board 1 at the time of a flow-soldering, and next, in order to shorten a time required for making a soldering to the circuit board 1, the lower surface 102 of the circuit board 1 is preheated with a preheating system 22 such as a sheath heater and the like, flow-soldering is made with the lead-free molten solder jet 3 from the lower surface 102 of the circuit board 1 with the upper surface 101 of the circuit board 1 heated with a board heating system 7, and both the upper and lower surfaces of the circuit board 1 are cooled immediately after the soldering. Moreover, if the upper surface 101 is cooled immediately after the soldering, a great temperature gradient occurs between the lower and upper surfaces since the lower surface 102 of the circuit board 1 is heated by lead-free molten jet 3, and for this reason, the upper surface 101 may be cooled after slightly heating the upper surface. As the result, a lift off of the insertion mount device connected portion can be prevented.

The above described board heating system 7 comprises a system which blows nitrogen in a temperature range of about 150° C. to about 200° C. (a temperature close to about 180° C. peak temperature on the upper surface of the circuit board 1) and at a flow rate of about 0.2 m$^3$/min. Further, immediately after the soldering, both surfaces of the circuit board are cooled with a temperature control unit 24 which adjusts temperatures of both surfaces of the board by applying nitrogen in a temperature range of, for example, about 5° C. to about 20° C. (a temperature about 15° C. lower than the room temperature 25° C.) and in individual flows (the lower surface of the board: 0.3 m$^3$/min; the upper surface of the board: 0.1 m$^3$/min) for about one minute. Peel off in the surface mount devices 2 and 4 caused by segregation of a component with a low melting point contained in the solder paste 11 can be prevented by installing the warp preventing jig 8 on the circuit board 1 and by flow-soldering with the upper surface of the circuit board 1 heated with the board heating system 7.

Moreover, for a solder alloy composition of the solder paste 11 used for a reflow-soldering, such a composition as Sn—Cu system, Sn—Ag system, Sn—Zn system, Sn—Ag—Cu system, Sn—Zn—Cu system, Sn—Zn—Bi system or Sn—Ag—Bi system, desirably, Sn-(1~4)Ag-(0~8)Bi-(0~1)Cu (Unit: Mass %) is used. In this composition, connecting strength of the surface mount device 2 such as a QFP-LSI and the like can be increased, and in addition, peel off of the surface mount device 2 can be prevented by reducing content of Bi, which is hard and brittle, for example, to 4 mass % or less. In this composition, when content of Bi is inversely increased, for example, more than 4 mass %, melting point as a solder paste can be lowered, and it can be suited to mount the surface mount device 2 which is inferior in the heat-resisting.

As for a composition of the molten solder jet 3 for a flow-soldering, an eutectic crystal composition or one similar to the eutectic crystal composition of Sn—Cu system, Sn—Ag system, Sn—Zn system, Sn—Ag—Cu system, Sn—Zn—Cu system, Sn—Zn—Bi system or Sn—Ag—Bi system is used. In particular, for the Sn—Ag—Cu base, highly reliable connection can be derived even under an extreme condition by using such a composition as Sn-3Ag-xBi-0.5Cu ($0 \leq x \leq 4$, Unit: Mass %) the melting point of which is higher than 183° C. melting point of the conventional Sn-37Pb. In addition, for the Sn—Ag—Bi system, when use temperature is limited, highly reliable connection can be derived by using such a composition as Sn-0.8Ag-57Bi.

First Embodiment

In a first embodiment, a lower surface 102 of a circuit board 1 is preheated by using only a sheath heater the maximum output of which is 9 kW, then, a flow-soldering is made with a lead-free molten solder jet 3 from the lower surface 102 of the circuit board 1 with an upper surface 101 of the circuit board 1 cooled with a board cooling system 6, and both surfaces of the circuit board 1 are cooled immediately after the soldering.

First, for the circuit board 1, a generally and widely used 1.6 mm thick, 350 by 350 mm glass epoxy board 1a with a 18 μm thick copper foil on the board surface and with through holes the inner diameter, Cu pad diameter, and density of which are respectively 1 mm, 1.6 mm and 0.7 holes per sq. cm was used.

For a surface mount device 2, a 32 mm square QFP-LSI 2a with 208 pieces of 42 alloy made lead plated with Sn-10 mass % Pb the lead pitch and lead width of which are respectively 0.5 mm and 0.2 mm was used.

And, the 32 mm square QFP-LSI 2a was flow-soldered on the upper surface of the glass epoxy board 1a with nine types of solder paste 11 the composition of which is Sn-3Ag-xBi-0.5Cu ($0 \leq x \leq 8$, Unit: Mass %). Details of the solder paste are indicated on Table 1 below.

TABLE 1

| Bi content (mass %) | Solder composition (mass %) | Solid-phase line (° C.) | Liquid-phase line (° C.) |
| --- | --- | --- | --- |
| 0 | Sn—3Ag—0.5Cu | 220 | 220 |
| 1 | Sn—3Ag—1Bi—0.5Cu | 215 | 218 |
| 2 | Sn—3Ag—2Bi—0.5Cu | 210 | 215 |
| 3 | Sn—3Ag—3Bi—0.5Cu | 206 | 215 |
| 4 | Sn—3Ag—4Bi—0.5Cu | 202 | 214 |
| 5 | Sn—3Ag—5Bi—0.5Cu | 197 | 214 |
| 6 | Sn—3Ag—6Bi—0.5Cu | 192 | 213 |
| 7 | Sn—3Ag—7Bi—0.5Cu | 187 | 212 |
| 8 | Sn—3Ag—8Bi—0.5Cu | 182 | 211 |

And, six pieces of 2.54 mm pitch 6-terminal connector 5a with Sn-10 mass % Pb plated 0.5 mm square terminals (leads) (A insertion mount device 5 on which lift off is likely to occur was selected.) were inserted into through holes (not shown) of the circuit board from the upper surface side of the board 1a to which four pieces of QFP-LSI 2a of this board sample were connected.

Next, using a flow-soldering system the total stroke of which was connected by one 4.2 meter long (total length) conveyor of 1.2 m/min. running speed which was provided with a board carry-in entrance at one end and a board carry-out exit at the other end, first, the lower surface 102 of the circuit board 1a to which no QFP-LSI 2a was connected was preheated with a board preheater 22 which used only a sheath heater the maximum output of which was 9 kW, and temperature on the lower surface of the circuit board 1a the temperature of which was 25° C. was raised to 118° C. (maximum) and 100° C. (minimum) within one minute.

And, the 6-terminal connectors 5a were soldered by applying solder jet 3a of Sn-3Ag-0.5Cu (Unit: Mass %) and Sn-0.8Ag-57Bi (unit: Mass %) which were similar to an eutectic crystal composition, to the lower surface 102 of the board 1a. In this case, however, a temperature of a flow solder tank (not shown) was fixed under several conditions so that a temperature of the molten solder in the flow solder tank was set to 170 to 260° C.

In the case of a solder of Sn-3Ag-0.5Cu (Unit: Mass %) which is similar to the eutectic crystal composition, it is required to set the temperature of the molten solder to 240° C. to 250° C. because the melting point is about 220° C. Further, in the case of a solder of Sn-0.8Ag-57Bi (Unit: Mass %) which is similar to eutectic crystal composition, it is required to set the temperature of the molten solder to 170° C. to about 200° C. because the melting point is about 137° C.

Further, in addition to the above, with the temperature of the flow solder tank placed under this condition, the upper surface 101 of the circuit board 1a was cooled this time by blowing nitrogen in a temperature range of 20° C. to about 50° C. at a flow rate of about 0.3 $m^3$/min with the board cooling system 6 during the soldering as shown in FIG. 1, and a board sample was made. By blowing nitrogen in a temperature range of 20° C. to 50° C. to the upper surface 101 of the circuit board 1a to actively cool down the upper surface as described above, a great temperature gradient occurs in between the lower surface 102 and the upper surface 101 of the circuit board 1a, and when Bi content of the solder paste 11 is reduced to 4 mass % or less, the allowable temperature range of flow-soldered molten solder can be expanded.

And, immediately after the soldering, both surfaces of the board 1a were cooled by blowing nitrogen in a temperature range from about 5° C. to 20° C. to the lower surface of the board at a flow rate of 0.3 $m^3$/min and to the upper surface of the board at a flow rate of 0.1 $m^3$/min for one minute with the temperature control unit 24 which adjusts temperatures of both surfaces of the board.

Figure 3:
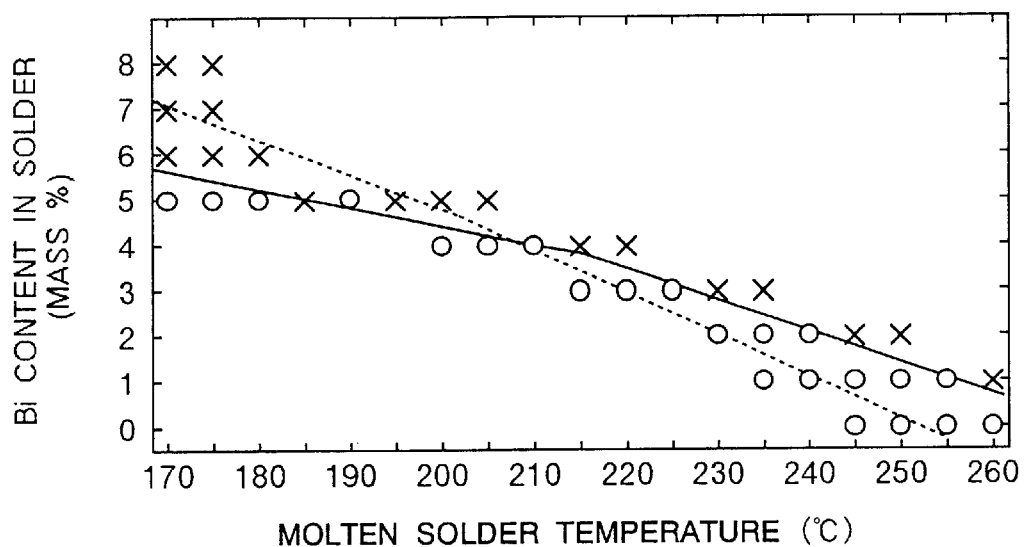
FIG. 3 shows QFP-LSI connected part breaking conditions (in the case where the surface of a circuit board to which a QFP-LSI is connected is cooled when making a flow-soldering on a packaging mount board after preheating) according to the first embodiment of the present invention.
Figure 4:
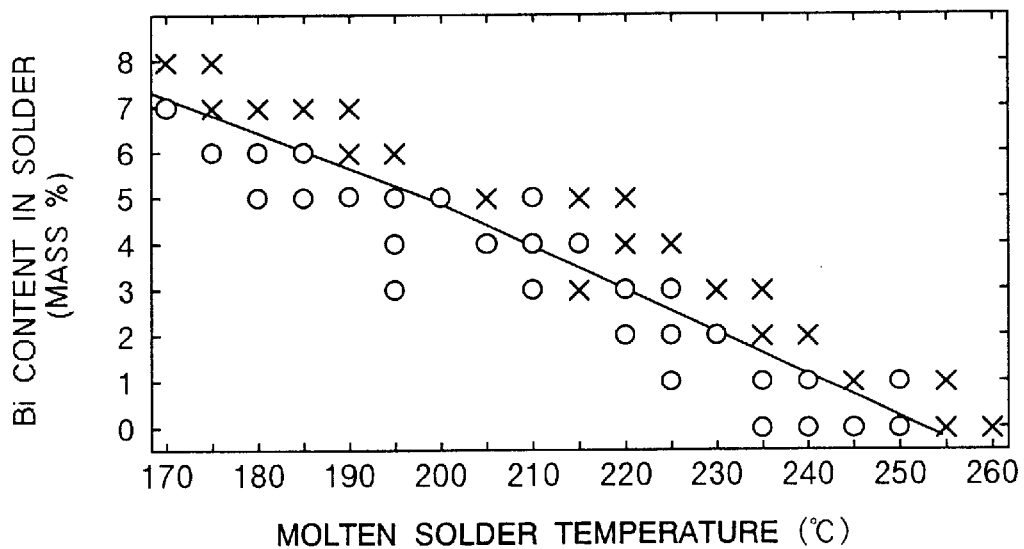
FIG. 4 shows QFP-LSI connected part breaking conditions under a comparing example (in the case where a flow-soldering is made on a packaging mount board after preheating) according to the first embodiment of the present invention.

Each sample described above was observed whether or not any breaking had occurred in the connected portion of the QFP-LSI 2a. FIG. 3 shows the results of the experiment in which the upper surface 101 of the board 1a was cooled with the board cooling system 6, and FIG. 4 shows the result of the experiment in which the upper surface 101 was not cooled. For both figures, molten solder temperatures in the flow solder tank are indicated on the horizontal axis, Bi contents of solder used to connect the QFP-LSI are indicated on the vertical axis, a condition under which no breaking occurred is indicated by a circle mark and a condition under which breaking occurred is indicated by a mark X. Moreover, the solid line in each of the figures is a line considered to be a boundary between the condition under which breaking occurred and the condition under which breaking did not occur. Further, to compare the results of the experiment of FIG. 3 with that of FIG. 4, the boundary of FIG. 4 is indicated in FIG. 3 with the dotted line.

As shown in FIG. 3, it was found, from the results of experiment in which the upper surface 101 of the board 1a was cooled, that the permissible temperature range of a molten solder in which a breaking of connected portion began to occur could be expanded from that at the time of a normal flow soldering, when Bi content of the solder paste 11 used for connection of the QFP-LSI 2a was less than 4 mass %.

To be more specific, by cooling the upper surface 101 of the circuit board 1a to about 20° C. to about 50° C., when Bi content of the solder paste 11 is 2 mass %, the allowable temperature range of molten solder in the flow-soldering tank can be expanded to 240° C. which is about 20° C. higher than 220° C. melting point, when Bi content of the solder paste 11 is 1 mass %, temperature of the molten solder in the flow soldering tank can be expanded to about 255° C. which is 35° C. higher than 220° C. melting point, allowing a temperature of molten solder in the flow-soldering tank under which breaking does not occur on the connected portion (reflow solder) of the QFP-LSI 2a to be set and controlled easily. In addition, since content of Bi of the solder paste 11, which Bi is hard and brittle, can be reduced to 2 mass % or less, connecting strength of the surface mount device 2 such as a QFP-LSI and the like can be increased, and further, peel-off of the surface mount device 2 can be prevented although the melting point increases slightly as shown in Table 1.

And, as for the time required in each step of the flow-soldering, an operation to carry the board 1a into the system required 30 seconds, flux applying time was one minute, preheating time was one minute, soldering time was 30 seconds, a time to control temperatures of both surfaces of the board was one minute, and an operation to carry out the board 1a from the system required 30 seconds, and the total time required in soldering one sheet of board 1a completely was five minutes plus 30 seconds.

Second Embodiment

In the second preferred embodiment, as shown in FIG. 2, a warp preventing jig 8 is attached on a circuit board 1, a lower surface 102 of the circuit board 1 is preheated next, then, a flow-soldering is made with lead-free molten solder jet 3b from the lower surface 102 of the circuit board 1 with a upper surface of the circuit board 1 heated with a board heating system 7, and both surfaces of the circuit board 1 are cooled immediately after the soldering. Thus, attaching the warp preventing jig 8 made of a metal such as aluminum and the like on the circuit board 1 so that a warp will not occur on the circuit board 1, even if a reflow-soldered portion 11 is melted during a flow-soldering, the reflow-soldered portion 11 can be solidified again and connected under a high reliability by retaining the surface mount device 2 on the surface of the circuit board 1 and cooling the surface mount device 2.

For the circuit board 1, the glass epoxy board 1a of the foregoing first embodiment was used. Further, for the surface mount device 2, the QFP-LSI 2a of the foregoing first embodiment was used.

And, on the upper surface of the glass epoxy board 1a, 32 mm square QFP-LSIs 2a were reflow-soldered with nine types of solder paste the composition of which was Sn-3Ag-xBi-0.5Cu ($0 \leq x \leq 8$, Unit: Mass %) (The foregoing Table 1 shows the details.) in the same manner as the foregoing first embodiment.

And, six 6-terminal connectors 5a were inserted into through holes (not shown) on the board 1a from the upper surface side of the board 1a to which four pieces of QFP-LSI 2a of the board sample were connected, in the same manner as the foregoing first embodiment.

Next, the warp preventing jig 8 made of metal such as aluminum and the like was attached on the foregoing board sample to prevent warping of the circuit board. The warp preventing jig 8 includes portions 8a where three out of four edges of the rectangular circuit board 1 are fixed and a pin 8b inserted into the hole (not shown) drilled in the center of the circuit board 1 to prevent vertical movement of the circuit board 1, as shown in FIG. 2.

Thus, attaching the warp preventing jig 8 on the circuit board 1, even if the reflow-soldered portion 11 was molten during a flow soldering, the reflow-soldered portion 11 could be solidified again and connected under a high reliability by retaining the surface mount device on the surface of the circuit board 1 and cooling the surface mount device 2.

And, using a flow-soldering system the total stroke of which was connected by one 4.2 meter long (total length) conveyor of 1.2 m/min. running speed, which system was provided with a board carry-in entrance at one end and a board carry-out exit at the other end, the lower surface 102 of the board 1a to which no QFP-LSI 2a was connected was preheated with use of only a sheath heater the maximum output of which was 9 kW, and a temperature on the lower surface of the board of which was 25° C. was raised to 119° C. (maximum) and 102° C. (minimum) within one minute.

And, five types of solder (Details are shown in Table 1) jet 3b the composition of which was Sn-3Ag-xBi-0.5Cu (0≦x≦4, Unit: Mass %) was applied to the lower surface of the board 1a, and 6-terminal connector 5a was soldered. In this case, however, a temperature of the flow solder tank was fixed so that the peak temperature at the upper surface 101 of the board to which QFP-LSI 2a was connected became 180° C.

Further, in addition to the above, with the temperature of the flow solder tank placed under this condition, the upper surface 101 of the board 1a was heated this time by blowing nitrogen in a temperature range from 150° C. to about 200° C. and at a flow rate of 0.2 m³/min with the board heating system 7 during the soldering as shown in FIG. 2, and thus, a board sample was made. Moreover, at this time, an arrangement was made so that a temperature of the upper surface of the board to which the QFP-LSI 2a was connected would not rise to 30° C. or higher than that on the surface of the QFP-LSI package.

And, immediately after the soldering, both surfaces of the board 1a were cooled by blowing about 5° C. to 20° C. nitrogen to the lower surface of the board at a flow rate of about 0.3 m³/min and to the upper surface of the board at 0.1 m³/min flow for about one minute with a temperature control unit 24 which adjusted temperatures of both surfaces of the board.

Each sample described above was observed whether or not any breaking had occurred in the connected portion of the QFP-LSI 2a. And, even when no breaking occurred, 45° C.-peel-test of lead was conducted, and a connected portion the strength of which had remarkably dropped was assumed to be broken.

Tables 2 and 3 show results of the test conducted by blowing high temperature nitrogen against the upper surface 101 of the board 1a with the board heating system 7 to heat the upper surface.

TABLE 2

| Bi content (mass %) | 45° peel strength (N) | Judgment |
|---|---|---|
| 0 | 7.5 | ○ |
| 1 | 7.2 | ○ |
| 2 | 7.3 | ○ |
| 3 | 6.5 | ○ |
| 4 | 6.9 | ○ |

TABLE 2-continued

| Bi content (mass %) | 45° peel strength (N) | Judgment |
|---|---|---|
| 5 | 6.3 | ○ |
| 6 | 6.7 | ○ |
| 7 | 6.2 | ○ |
| 8 | 2.9 | X |

TABLE 3

| Bi content (mass %) | Lift off | Shrinkage cavity | Judgment |
|---|---|---|---|
| 0 | ○ | ○ | ○ |
| 1 | ○ | ○ | ○ |
| 2 | ○ | ○ | ○ |
| 3 | ○ | ○ | ○ |
| 4 | X | X | X |

Tables 4 and 5 show results of the test conducted without blowing high temperature nitrogen against the upper surface 101 of the board 1a.

TABLE 4

| Bi content (mass %) | 45° peel strength (N) | Judgment |
|---|---|---|
| 0 | 7.5 | ○ |
| 1 | 7.2 | ○ |
| 2 | 7.3 | ○ |
| 3 | 6.5 | ○ |
| 4 | 6.9 | ○ |
| 5 | 3.2 | X |
| 6 | 2.7 | X |
| 7 | 2.9 | X |
| 8 | 2.9 | X |

TABLE 5

| Bi content (mass %) | Lift off | Shrinkage cavity | Judgment |
|---|---|---|---|
| 0 | ○ | ○ | ○ |
| 1 | ○ | ○ | ○ |
| 2 | ○ | X | X |
| 3 | X | X | X |
| 4 | X | X | X |

According to the results of the test conducted without blowing high temperature nitrogen shown in Tables 4 and 5, it was found that the upper limit of a Bi content of a solder paste 11 which could be used for connection of the QFP-LSI 2a was 4 mass %, the upper limit of the Bi content of a flow solder which could be used for connection of the 6-terminal connector 5a was 1 mass %, and that when the Bi content exceeded these limits, a breaking had occurred on the connected portion of QFP-LSI 2a and a lift off and/or a shrinkage cavity had occurred on the connected portion of the connector 5a.

However, it was found that the allowable composition range (an upper limit of the Bi content) of a solder could be expanded from that at the time of a normal flow-soldering because the upper limit of the Bi content of the solder paste which could be used for connection of the QFP-LSI 2a could be increased to 7 mass %, and the upper limit of the Bi content of the flow solder which could be used for connection of the 6-terminal connector 5a could be increased to 3 mass % by blowing high temperature nitrogen against the upper surface of the board 1a to heat it, as shown in the test results of Tables 2 and 3. Thus, for the composition of solder paste used for connection of a surface mount device 2, the upper limit of the Bi content can be increased to 7 mass % and melting point can be lowered by installing the warp preventing jig 8 on the circuit board 1a and by heating the upper surface 101 of the circuit board 1a, and as the result, it becomes possible to reflow-solder, with lead-free, the surface mount device 2 with a low heat resistance. Further, also for a flow solder, the Bi content can be increased slightly, causing it to be similar to an eutectic crystal composition.

And, as for the time required at each step of the flow-soldering, the operation to carry the board 1a into the system required 30 seconds, flux applying time was one minute, preheating time was one minute, soldering time was 30 seconds, time to control temperatures of both surfaces of the board was one minute, and the operation to carry out the board 1a from the system required 30 seconds, and total time required for soldering one sheet of the board 1a completely was 5 minutes plus 30 seconds.

Third Embodiment

In the third embodiment, a lower surface 102 of a circuit board 1 is preheated rapidly by using a sheath heater the maximum output of which is 9 kW and a fan to set temperature of the lower surface of the board to 120° C. at the highest portion and 107° C. at the lowest portion within about 30 seconds, then, as shown in FIG. 2, in the same manner as the first embodiment, with an upper surface 101 of the circuit board 1 cooled with the board cooling system 6, flow-soldering is made from the lower surface of the circuit board 1 with lead-free molten solder jet 3, and both surfaces of the circuit board 1 are cooled immediately after the soldering.

To be more specific, in the third embodiment, using a flow-soldering system the total stroke of which was connected by one 4.2 meter long (total length) conveyor of 1.2 m/min. running speed which was provided with a board carry-in entrance at one end and a board carry-out exit at the other end, the lower surface 102 of the board 1a to which a QFP-LSI 2a was not connected was preheated rapidly by using a sheath heater the maximum output of which was 9 kW and a fan, and a temperature of the lower surface of the circuit board was set to 120° C. at the highest portion and 107° C. at the lowest portion within about 30 seconds.

And, 6-terminal connectors 5a were soldered by applying solder jet 3a of Sn-3Ag-0.5Cu and Sn-0.8Ag-57Bi (Unit: Mass %) which were close to an eutectic crystal composition to the lower surface of the circuit board. In this case, however, a temperature of a flow solder tank was fixed under several conditions so that temperature of the molten solder in the flow solder tank was 170 to 260° C. Further, in addition to the above, with the temperature of the flow solder tank placed under this condition, nitrogen in a temperature range from about 20° C. to 50° C. was blown against the upper surface of the board at a flow rate of 0.3 m³/min. to cool it, during the soldering this time, and thus, circuit board samples were made.

And, immediately after the soldering, nitrogen in a temperature range from 5° C. to 20° C. was blown against the lower surface of the board at a flow rate of 0.3 m³/min. and against the upper surface of the board at 0.1 m³/min. for about one minute with a temperature controller which adjusted temperatures of both surfaces of the board.

Figure 5:
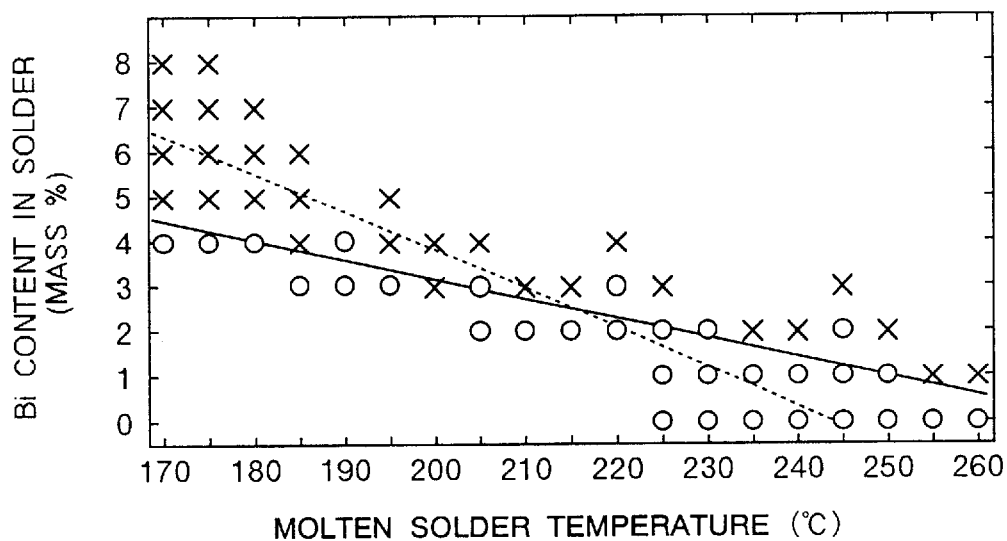
FIG. 5 shows QFP-LSI connected part breaking conditions (in the case where the surface of a circuit board to which a QFP-LSI is connected is cooled when making a flow-soldering on a packaging mount board after making a rapid preheating) according to the third embodiment of the present invention.
Figure 6:
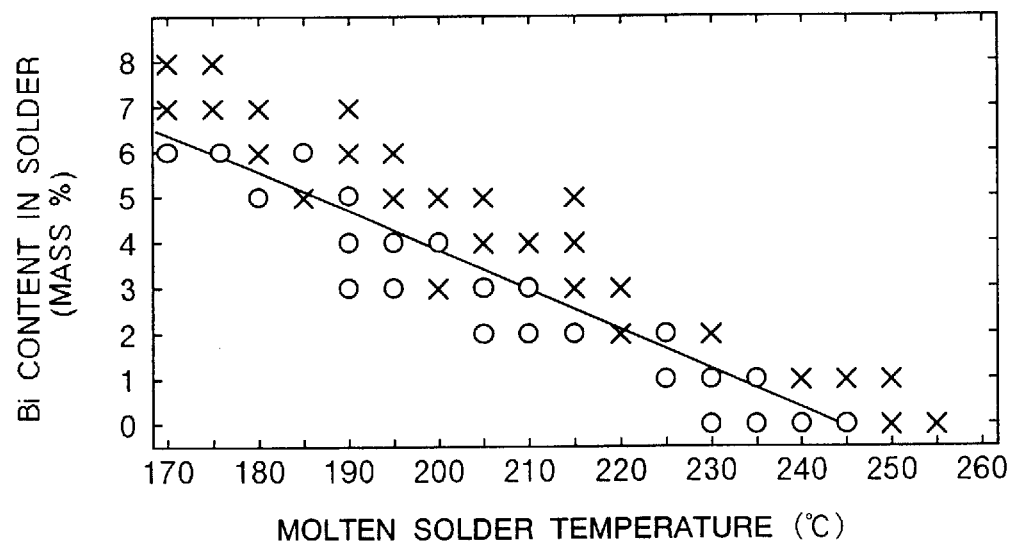
FIG. 6 shows QFP-LSI connected part breaking conditions under a comparing example (in the case where a flow-soldering is made on a packaging mount board after making a rapid preheating) according to the third embodiment of the present invention.

Each sample described above was observed whether or not any breaking had occurred in the connected portion of a QFP-LSI or not. FIG. 5 shows results of the experiment in which the upper surface 101 of the board 1a was flow-soldered with the upper surface cooled with a board cooling system 6 after a rapid preheating, and FIG. 6 shows results of the experiment in which the upper surface was preheated rapidly but not cooled after the rapid preheating. For both figures, molten solder temperatures are indicated on the horizontal axis, Bi contents of solder used to connect the QFP-LSI are indicated on the vertical axis, a condition under which no breaking occurred is indicated by a circle mark and a condition under which a breaking occurred is indicated by a mark X. Moreover, the solid line in each of the figures is a line considered to be a boundary between the condition under which breaking occurred and the condition under which breaking did not occur. Further, to compare the result of experiment of FIG. 5 with that of FIG. 6, the boundary of FIG. 6 is indicated in FIG. 5 with the dotted line.

As shown in FIG. 5, it was found, from the result of experiment in which the upper surface 101 of the board 1a was cooled after preheating rapidly, that the allowable temperature range of a molten solder in which breaking of the connected portion began to occur could be expanded from that at the time of a normal flow soldering, when Bi content of the solder paste 11 used for connection of the QFP-LSI 2a was 2.5 mass % or less.

To be more specific, by cooling the upper surface 101 of the circuit board 1a, when Bi content is 1 mass %, the allowable temperature range of molten solder can be expanded to about 250° C., allowing a temperature of molten solder in the flow-solder tank under which breaking does not occur on the connected portion (reflow-solder) of the QFP-LSI 2a to be set and controlled easily. As a composition of the solder paste 11, when Bi content is 2.5 mass % or less, rapid preheating can be made in the range in which the temperature of molten solder in the flow-solder tank can be set easily.

As for the time required in each step of the flow-soldering, an operation to carry the board 1a into the system required 30 seconds, flux applying time was one minute, rapid preheating time was 30 seconds, soldering time was 30 seconds, time to control temperatures of both surfaces of the board was one minute, an operation to carry out the board 1a from the system required 30 seconds, and the total time required in soldering one sheet of the board 1a completely was five minutes.

Fourth Embodiment

In the fourth preferred embodiment, as shown in FIG. 2, a warp preventing jig 8 is attached on the circuit board 1, next, the lower surface 102 of the circuit board 1 is preheated rapidly by using a sheath heater the maximum output of which is 9 kW and a fan, temperature of the lower surface of the board is set to 117° C. at the highest portion and to 109° C. at the lowest portion within about 30 seconds, then, with the upper surface of the circuit boards 1 heated with a board heating system 7 in the same manner as the second embodiment, a flow-solder is made with lead-free molten solder jet 3b from the lower surface of the circuit board 1, and both surfaces of the circuit board 1 are cooled after the soldering.

And, using a flow-soldering system the total stroke of which was connected by one 4.2 meter long (total length) conveyor of 1.2 m/min. running speed which was provided with a board carry-in entrance at one end and a board carry-out exit at the other end, the lower surface 102 of the board 1a to which QFP-LSI 2a was not connected was preheated rapidly by using a sheath heater the maximum output of which was 9 kW and a fan, and temperature of the lower surface of the circuit board was set to about 117° C. at the highest portion and 109° C. at the lowest portion. And, five types of solder jet 3b the composition of which was Sn-3Ag-xBi-0.5Cu (0≦x≦4, Unit: Mass %) (Details are shown in the foregoing Table 1) were applied to the lower surface of the board, and a 6-terminal connector 5a was soldered. In this case, however, temperature of a flow-solder tank was fixed so that the peak temperature on the upper surface of the board to which the QFP-LSI was connected was 180° C.

Further, in addition to the above, with the temperature of the flow-solder tank placed under this condition, nitrogen in a temperature range from 150° C. to 200° C. was blown against the upper surface of the board at a flow rate of 0.2 m³/min to heat it, during the soldering this time, and thus, circuit board samples were made.

Further, at this time, it was so arranged that the temperature on the upper surface of the board to which a QFP-LSI was connected would never rise 30° C. or higher than the QFP-LSI package surface temperature in any case.

And, immediately after the soldering, nitrogen in a temperature range from 5° C. to 20° C. was blown to the lower surface of the board at a flow rate of 0.3 m³/min. and to the upper surface of the board at 0.1 m³/min. with a temperature control unit 24 which adjusted temperatures of both surfaces of the board.

Each sample described above was observed whether or not ant breaking had occurred in the connected portion of the QFP-LSI 2a. And, even when no breaking occurred, a 45° peel test of lead was conducted, and a connected portion the strength of which had remarkably dropped was assumed to be broken.

Tables 6 and 7 show results of the test conducted by attaching the warp preventing jig 8 on the circuit board 1a, preheating the lower surface 102 of the circuit board 1a rapidly, and flow-soldering by blowing nitrogen of high temperature against the upper surface 101 of the circuit board 1a after the rapid preheating.

TABLE 6

| Bi content (mass %) | 45° peel strength (N) | Judgment |
|---|---|---|
| 0 | 7.4 | ○ |
| 1 | 7.1 | ○ |
| 2 | 7.3 | ○ |
| 3 | 6.6 | ○ |
| 4 | 7.2 | ○ |
| 5 | 6.4 | ○ |
| 6 | 6.2 | ○ |
| 7 | 2.9 | X |
| 8 | 3.5 | X |

TABLE 7

| Bi content (mass %) | Lift off | Shrinkage cavity | Judgment |
|---|---|---|---|
| 0 | ○ | ○ | ○ |
| 1 | ○ | ○ | ○ |
| 2 | ○ | ○ | ○ |
| 3 | ○ | ○ | ○ |
| 4 | X | X | X |

Tables 8 and 9 show results of the test conducted by attaching the warp preventing jig 8 on the circuit board 1a, rapidly preheating the lower surface 102 of the circuit board 1a, and by flow-soldering without blowing high temperature nitrogen to the upper surface 101 of the circuit board 1a after the rapid preheating.

TABLE 8

| Bi content (mass %) | 45° peel strength (N) | Judgment |
|---|---|---|
| 0 | 7.1 | ○ |
| 1 | 7.2 | ○ |
| 2 | 6.4 | ○ |
| 3 | 2.9 | X |
| 4 | 3.2 | X |
| 5 | 3.0 | X |
| 6 | 2.7 | X |
| 7 | 2.9 | X |
| 8 | 2.6 | X |

TABLE 9

| Bi content (mass %) | Lift off | Shrinkage cavity | Judgment |
|---|---|---|---|
| 0 | ○ | ○ | ○ |
| 1 | ○ | ○ | ○ |
| 2 | X | X | X |
| 3 | X | X | X |
| 4 | X | X | X |

According to the results of experiment shown in Tables 8 and 9, it was found that the upper limit of Bi content of a solder which could be used for connection of the QFP-LSI was 2 mass %, the upper limit of Bi content of solder which could be used for connection of the 6-terminal connector was 1 mass %, and that when Bi content exceeded this upper limit, a breaking had occurred on the QFP-LSI connected portion, and a lift off and/or shrinkage cavity had occurred on the connector connected portion.

However, it was found that a composition range of a solder which can be used could be expanded from that at the time of a normal flow-solder because the upper limit of Bi content of a solder used to connect a QFP-LSI was caused to be 6 mass % by blowing nitrogen, and because the upper limit of Bi content of a solder used to connect a 6-terminal connector was caused to be 3 mass % by blowing nitrogen as shown in the foregoing Tables 6 and 7.

In other words, even if a rapid preheating is made, a solder paste 11 the composition of which is as such that the upper limit of Bi content is 6 mass % and melting point is low can also be used. Further, also for the flow-solder, even if a rapid preheating is made, Bi content can be increased slightly, and the composition can be made to be similar to an eutectic crystal composition.

As for the time required at each step of the flow-soldering, an operation to carry the circuit board to the system required 30 seconds, flux applying time was one minute, preheating time was 30 seconds, soldering time was 30 seconds, time to control temperatures of both surfaces of the board was one minute, and an operation to carry out the circuit board from the system required 30 seconds, and total time required in soldering one sheet of the circuit board 1a completely was five minutes.

With the above described third and fourth embodiments, the flow-soldering surface of a circuit board can be rapidly preheated by a high output heater, and a time required in preheating can be shortened, allowing the productivity to be improved.

Next, referring to drawings, the soldering apparatus or system according to embodiments of the present invention are described.

Figure 7:
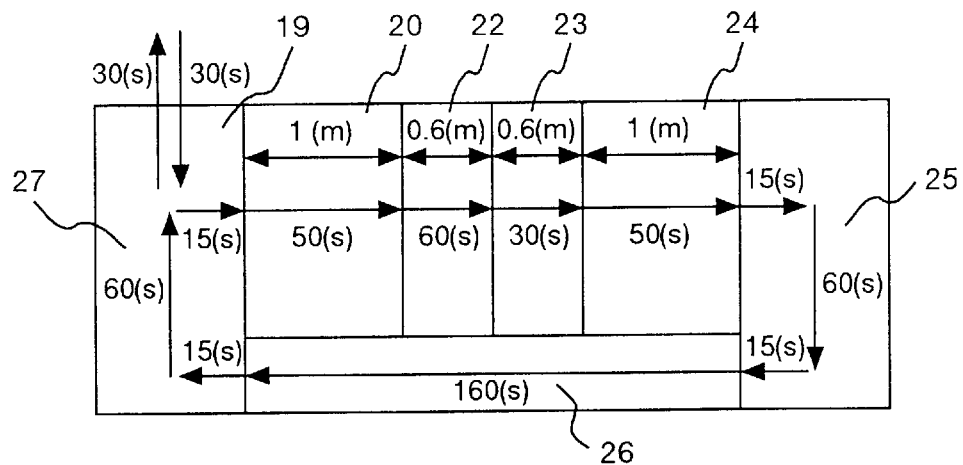
FIG. 7 is an elevation showing the flow-soldering system using lead-free solder according to the first embodiment of the present invention.

FIG. 7 is an elevation of the first embodiment in which in a flow-soldering system with which one worker can carry in and out circuit boards 1 to and from the system at the same position 18 by moving the circuit boards 1 back and forth with two conveyors arranged in parallel in the top and bottom of the system used, a length of the preheating step is 0.6 m, and to which such a structure as to float up the circuit boards 1 from the conveyor on the preheating unit (not shown) and to stop the circuit boards for 30 seconds regardless of movements of the conveyor is added. Thus, the entire plane of the lower surface 102 of the circuit boards 1 is preheated for total 60 seconds including moving time and stopping time.

This flow-soldering system includes a first half conveyor which carries circuit boards 1 to which surface mount devices 2 and 4 are soldered and insertion mount devices 5 are inserted, from a small conveyor 27 equipped with an elevator to a small conveyor 25 equipped with an elevator, on the top, the small conveyor 25 equipped with a down lifting elevator which transfers the circuit boards 1 from the first-half conveyor to an inverse running conveyor 26, the inverse running conveyor 26 (last half conveyor) (in parallel to the top first half conveyor; runs toward the inverse direction; exists immediately below the top first half conveyor) which returns the circuit boards transferred from the small conveyor 25, and a small conveyor 27 equipped with an up lifting elevator which lifts up the returned circuit boards and returns them to a circuit board carry-in entrance 18. It should be noted that this small conveyor 27 functions to carry new circuit boards from the circuit board carry-in entrance 18 to a fluxer.

The first half conveyor comprises a small conveyor unit 19 which carries circuit boards from the circuit board carry-in entrance 18 to the fluxer (carrying distance: 0.3 m), a carrier unit 20 which applies flux to the lower surface 102 of the circuit boards 1 (carrying distance: 1 m), a preheating carrier unit 22 (carrying distance: 1.2 m), a flow-soldering carrier unit 23 (carrying distance: 0.6 m), and a carrier unit 24 which controls temperatures of both surfaces of the circuit boards.

Now, carrying velocity of the 3.8 m long (total length) top large conveyor 20 through 24 which includes a flux applying step 20a, a preheating step 22a, a flow-soldering step 23a, and a temperature control step 24a which adjusts temperatures of both surfaces of circuit boards is 1.2 m/min., carrying velocity of the small conveyor 25 equipped with the lifting down elevator is 1.2 m/min., carrying velocity of the inverse running conveyor 26 is 1.2 m/min., and carrying velocity of the small conveyor 27 equipped with the lifting up elevator (0.6 meter long) is 1.2 m/min.

And, the same subjects to be flow-soldered using lead-free solder, preheating conditions and flow-soldering conditions as those of the first embodiment were selected.

Times required in the individual steps in the flow-soldering were;
(1) Time to carry a circuit board into the system: 30 sec.
(2) Time required by the small conveyor 27 equipped with the up lifting elevator to move the circuit board to the fluxer: 15 sec.
(3) Flux applying time: 50 sec.
(4) Preheating time: 60 sec.
(5) Flow-soldering time: 30 sec.
(6) Time to control temperatures of both surfaces of the circuit board: 50 sec.
(7) Moving time by the small conveyor equipped with the down lifting elevator: 15 sec.
(8) Carrying time by the down lifting elevator of the small conveyor: 60 sec.
(9) moving time to the inverse running conveyor by the small conveyor equipped with the down lifting elevator: 15 sec.
(10) Carrying time by the inverse running conveyor 26: 190 sec.
(11) Moving time by the small conveyor 27 equipped with the up lifting elevator: 15 sec.
(12) Carrying time by the up lifting elevator of the small conveyor 27: 60 sec.
(13) Time to carry out a circuit board 1 from the system: 30 sec., and total time required in soldering one sheet of the circuit board completely was 10 minutes plus 20 seconds.

Figure 8:
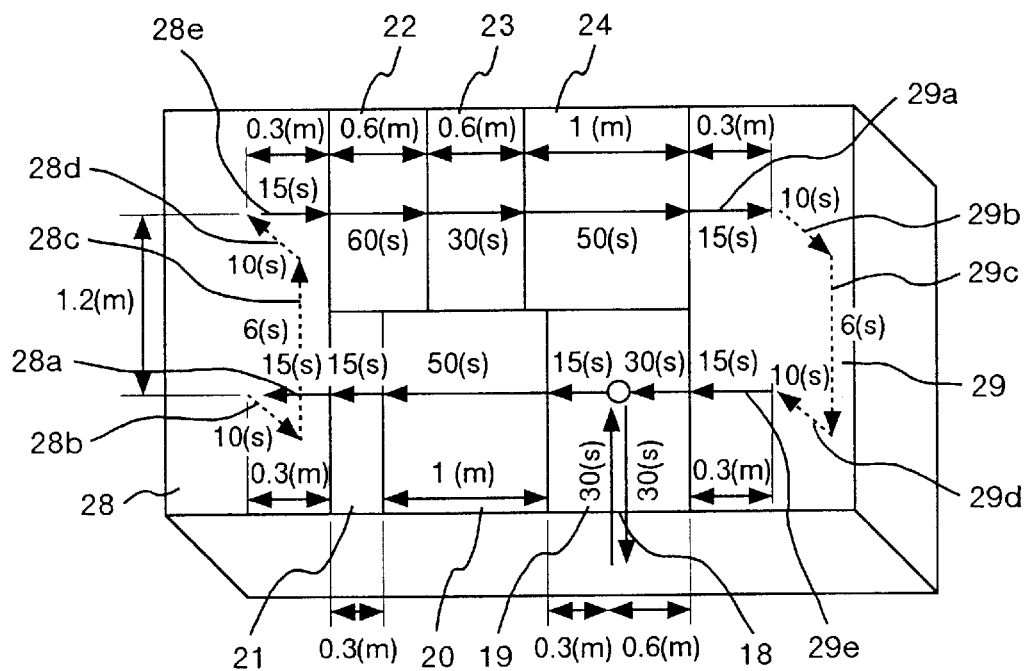
FIG. 8 is a top perspective schematic view showing the flow-soldering system using lead-free solder according to the first embodiment of the present invention.

FIG. 8 is a top perspective view of the second preferred embodiment in which in a flow-soldering system with which one worker can carry in and out circuit boards at the same position as four conveyors circulate circuit boards within the system along a rectangular route, a length of preheating step is 0.6 m, to which such a structure as to float up the circuit boards 1 from the conveyor on the preheating unit (not shown) and to stop the circuit boards for 30 seconds regardless of movements of the conveyor is added, and further, in which the conveyors not directly involved in soldering are operated independently under a high speed so as to shorten the carrying time.

This flow-soldering system includes a carrier unit (carrying distance: 0.3 m) 19 which carries circuit boards 1 to which surface mount devices 2 and 4 are soldered and insertion mount devices 5 are inserted, from a board carry-in unit to a fluxer, a flux applying carrier unit (carrying distance: 1 m) 20, a carrier unit not involved in soldering (carrying distance: 0.3 m) 21, a side carrier unit equipped with an elevator 28, a preheating carrier unit (carrying distance 0.6 m) 22, a flow-soldering carrier unit (carrying distance: 0.6 m) 23, a temperature controlling carrier unit which adjusts both surfaces of a circuit board (carrying distance: 1 m) 24, a side carrier unit equipped with an elevator 29, and a carrier unit not involved in soldering, which returns the circuit boards to a board carrier unit 18 (carrying distance: 0.6 m) 19. As shown in FIGS. 1 and 2, the flow-soldering carrier unit, to be more specific, the flow-soldering unit 23 on which a flow solder tank is installed is equipped with a system which detects the completion of a soldering by sensing a position of a board holder.

The side carrier unit 28 with the elevator includes a small conveyor carrier unit (carrying distance: 0.3 m) 28a, a down lifting small conveyor unit 28b, a bottom carrier conveyor unit (carrying distance 1.2 m) 28c, up lifting small conveyor unit 28d, and a small conveyor carrier unit (carrying distance: 0.3 m) 28e.

Also, the side carrier unit 29 equipped with the elevator includes a small conveyor carrier unit (carrying distance: 0.3 m) 29*a,* a down lifting small conveyor unit 29*b,* a bottom carrier conveyor unit (carrying distance 1.2 m) 29*c,* an up lifting small conveyor unit 29*d,* and a small conveyor carrier unit (carrying distance: 0.3 m) 29*e.*

Moreover, a carrying velocity of the 2.2 meter long (total length) conveyor which comprised of a circuit board carrier not involved in soldering (carrying distance 0.6 m), a circuit board carrier 19*a* which carried circuit boards from the circuit board carry-in unit to the fluxer, a flux applying step 20*a,* and a circuit board carrier 21*a* which was not involved in soldering was set to 1.2 m/min., a carrying velocity of the 2.2 meter long (total length) conveyor which comprised of a preheating step 22*a,* a flow-soldering step 23*a,* and a temperature controlling step 24*a* in which temperatures of both surfaces of a circuit board were adjusted was set to 1.2 m/min., a length of the small conveyor with two down lifting elevators was 0.6 m, and its carrying velocity was set to 1.2 m/min. A length of the small conveyor with two up lifting elevators was 0.6 m, its carrying velocity was set to 1.2 m/min., and a carrying velocity of two bottom circuit board carrying conveyors not involved in soldering was increased to 12 m/min.

Further, the lower surface of circuit board to which no QFP-LSI is connected was preheated by means of a sheath heater the maximum output of which was 4.5 kW, and a temperature on the lower surface of the circuit board was set to 121° C. at the highest portion and to 107° C. at the lowest portion within about one minute.

And, under the same flow-soldering conditions as those of the first preferred embodiment, circuit board samples were made.

Times required in the individual steps in the flow-soldering were;
(1) Time to carry in a circuit board at the circuit board carry-in unit: 30 sec.
(2) Moving time to the fluxer: 15 sec.
(3) Flux applying time: 50 sec.
(4) Circuit board carrying time not involved in soldering: 15 sec.
(5) Moving time to the small conveyor equipped with the down lifting elevator: 15 sec.
(6) Carrying time by the down lifting elevator: 10 sec.
(7) Moving time to the circuit board carrier and up lifting elevator by the bottom circuit board carrying conveyor: 6 sec.
(8) Carrying time by the up lifting elevator: 10 sec.
(9) Moving time from the small conveyor with the up lifting elevator to the preheater unit: 15 sec.
(10) Preheating time: 60 sec.
(11) Flow-soldering time: 30 sec.
(12) Time to control temperatures of both surfaces of a circuit board: 50 sec.
(13) Moving time to the small conveyor with the down lifting elevator: 15 sec.
(14) Carrying time by the down lifting elevator: 10 sec.
(15) Moving time to the circuit board carrying and up lifting elevator by the bottom circuit board carrying conveyor: 6 sec.
(16) Carrying time by the up lifting elevator: 10 sec.
(17) Moving time on the small conveyor with the up lifting elevator: 15 sec.
(18) Circuit board carrying time to the circuit board carry-in unit: 30 sec.
(19) Circuit board carry out work at the circuit board carry-in unit: 30 sec., and total time required for soldering one sheet of circuit board completely was seven minutes plus 32 seconds.

Figure 9:
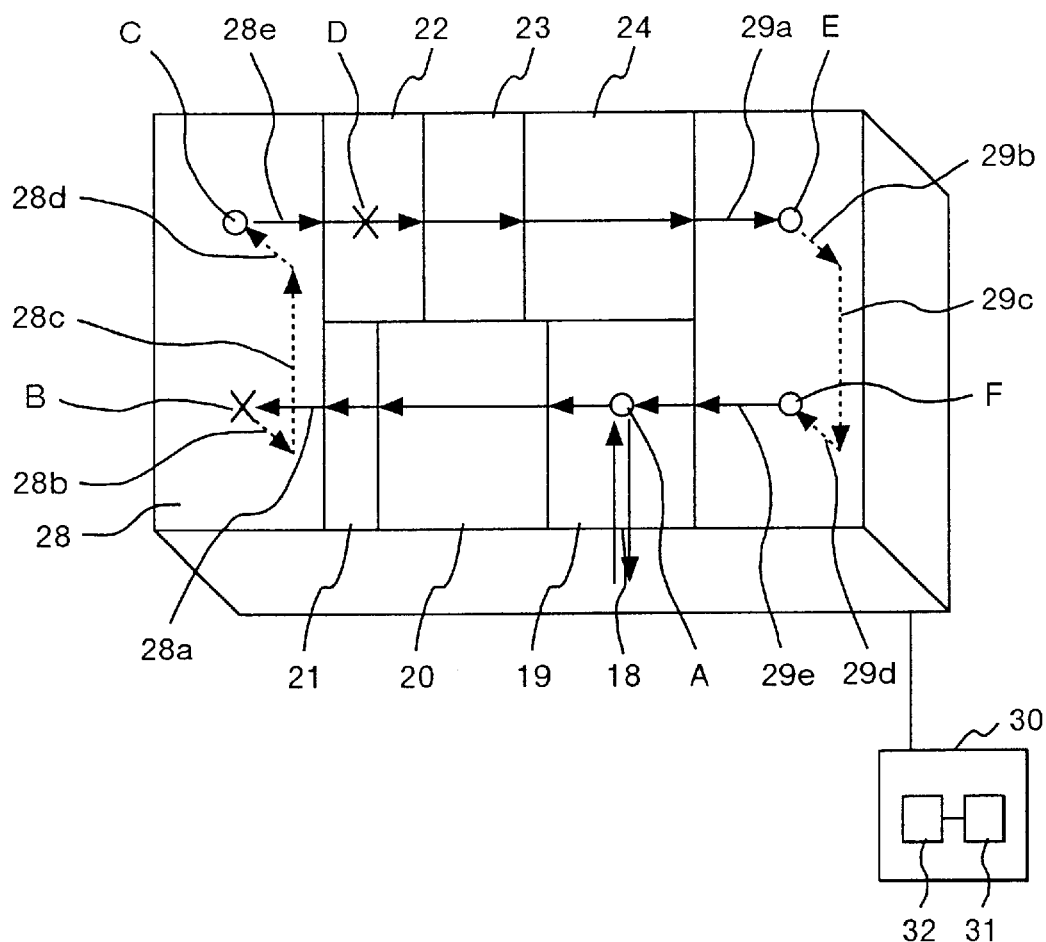
FIG. 9 is a top perspective schematic view showing the flow-soldering system using lead-free solder according to the third embodiment of the present invention.

FIG. 9 is a top perspective view of the third preferred embodiment in which in a flow-soldering system with which one worker can carry in and out circuit boards at the same position as four conveyors circulate circuit boards within the system along a rectangular route, to which system the following functions are added.
(a) The preheating step is the same as that of the second preferred embodiment.
(b) In order to shorten the carrying time, two bottom carrying conveyors 28*c* and 29*c* which are not directly involved in soldering are operated under a high speed (12 m/min.).
(c) Variable carrying speeds from 0.5 to 2.0 m/min. are used for the conveyors other than two bottom carrying conveyors, and it is so arranged that a carrying speed can be input in advance at the time of a circuit board carry-in.
(d) Sizes of carried circuit boards are limited to maximum 360×360 mm and minimum 100×100 mm, movable type circuit board fixing jigs (not shown) are provided to mount circuit boards of any sizes within this range, four pieces of circuit board holder (not shown) in size 550×550 mm provided with pins (not shown) which hold the circuit boards 1 from the top and bottom through the openings provided in the circuit board centers in advance to prevent warping of the circuit boards due to a thermal influence at the time of flow-soldering are made, and the circuit boards 1 are carried within the system through four pieces of the circuit board holder. Further, four board holders are arranged in four stations in positions indicated by white circles in FIG. 9; namely,
A: Circuit board carry-in unit
C: On the small conveyor 28*d* equipped with an up lifting elevator located immediately before the preheating step 22*a*
E: On the small conveyor 29*b* equipped with a down lifting elevator immediately after the temperature control step 24*a* in which temperatures of both surfaces of a circuit board are adjusted
F: On the small conveyor 29*d* equipped with an up lifting elevator immediately before the circuit board carry-in unit 30; and four board holders are circulated from these positions.

Further, when a board holder reaches the circuit board carry-in unit A (when a completely soldered circuit board exists, after removing the circuit board), a new circuit board is carried in.

Furthermore,
B: On the small conveyor 28*b* equipped with a down lifting elevator immediately after the flux applying step 20*a,* and
D: A preheater unit 22*a* is also used as stations, and it is so arranged that two or more board holders will not exist on the conveyor between two adjacent stations when four board holders are moving among total six stations. This is to control movements of the board holders independently and to prevent collisions in the system.

For this purpose, using the circuit board carry-in unit as the starting point, six stations are named A, B, C, D, E, and F in the holder passing sequence.

To be more specific,
A: Circuit board carry-in unit
B: On the small conveyor equipped with a down lifting elevator immediately after the flux applying step
C: On the small conveyor equipped with an up lifting elevator immediately before the preheating step
D: Preheater unit
E: On the small conveyor equipped with a down lifting elevator immediately after the temperature control step in which temperatures of both surfaces of a circuit board are adjusted F: On the small conveyor equipped with an up lifting elevator immediately before the circuit board carry-in unit Next, in the aforementioned flow-soldering system, a control system 30 which controls conveyors independently is equipped with a control memory 31 having plural data storing units.

Moreover, in the individual data storing units, optimum stop time T at which each circuit board 1 should be stopped on the preheating unit 22 and optimum circuit board carrying velocity V during soldering are stored.

For example, a case of operation in which circuit boards X and Y the optimum stop times T at the preheating unit 22 and optimum circuit board carrying velocities V during soldering of which differ are carried continuously in this flow-soldering system is considered. Now, a circuit board ((optimum stop time at the preheating unit, Optimum circuit board carrying velocity during soldering)=(Tx, Vx)) X is set on a board holder in the circuit board carry-in unit (Station A), and after inputting the (Tx, Vx) into a control unit 30, carrying of the board holder is started by depressing a start button (not shown) under a control of a computer 32 built in the control unit 30.

At this time, the board holder is carried toward the station B. Next, it is so arranged that after detecting that the circuit board X started from the station B with a sensor (not shown), the next board holder is carried toward the circuit board carry-in unit (station A).

And, it is so controlled that the next circuit board Y can pass the station B at the time when the circuit board X starts from station C. Next, the circuit board X stops at the preheating unit (station D) 22 for time Tx, where the circuit board X is preheated. At this time, data (Tx, Vx) of the circuit board X exist in the data storing unit. Thus, the conveyors from the preheating unit 22 to the temperature control unit 24 which adjusts both surfaces of the circuit board are moving at a carrying velocity Vx. After an elapse of a time Tx, the circuit board X starts to be carried under the optimum carrying velocity Vx for the soldering.

And, after detecting that the circuit board X passed through the flow-soldering unit 23 with the sensor, data (Ty, Vy) of the next circuit board Y are stored into the data storing unit, the next circuit board Y starts the station C, and the optimum preheating and soldering are made. Also, thereafter, the system carries the board holders in the same procedure and sequence.

Such a case as that the first circuit board X has arrived station E, but a board holder in front of it cannot start the station F and the second circuit board Y has already started the station D can be happened. For a case like this, it is so arranged that immediately after detecting that the second circuit board Y passed the flow-soldering unit 23 with the sensor, conveyors from the preheating unit 22 to the temperature control unit 24 which adjusts temperatures of both surfaces of the circuit board are caused to stop, thereby preventing collisions of carriers. Also, thereafter, the board holders are carried in the same procedure and sequence.

And, thereafter, the first circuit board X passes through station F and returns to the station A after insuring that no holder exists in the forward station.

Also for the second circuit board, the board holder is moved in the same procedure after insuring that no holder exists in the forward station.

Moreover, input data are;

(Tx, Vx)=(30 sec., 1.2 m/min.)

(Ty, Vy)=(5 sec., 1.5 m/min.)

Further, when the board holder which had carried a circuit board on which soldering had been completed arrived the circuit board carry-in unit 19, the circuit board was carried out within 30 seconds, and immediately after carrying in the next circuit board and inputting the data within total 30 seconds, the start button was depressed.

Next, carry-in starting times and carry-out ending times for the 2nd circuit board and thereafter after carrying the 1st circuit board into the system were examined.

As a result, it has been found that circuit board carry-in starting times are;

1st circuit board (Board X): 0 min.00 sec. later

2nd circuit board (Board Y): 1 min.15 sec. later

3rd circuit board (Board X): 2 min.50 sec. later

4th circuit board (Board Y): 4 min.25 sec. later

5th circuit board (Board X): 7 min.22 sec. later

6th circuit board (Board Y): 8 min.37 sec. later

Circuit board carry-out ending times are;

1st circuit board (Board X): 6 min.52 sec. later

2nd circuit board (Board Y): 8 min.37 sec. later

3rd circuit board (Board X): 10 min.22 sec. later

4th circuit board (Board Y): 12 min.07 sec. later

5th circuit board (Board X): 13 min.52 sec. later

6th circuit board (Board Y): 15 min.37 sec. later, and thus, circuit boards the quantity of the heat normally required in preheating the circuit boards, circuit board carrying velocity during soldering, and size of the circuit boards of which each differ can be produced continuously by inputting necessary conditions in advance, enabling a production of one sheet of circuit board in every 1 minute plus 45 seconds.

Further, according to this embodiment, a soldering can be made without a time required for stabilizing output of a heater for preheating, in other words, without a loss time spent by changing a course of action, and thus, circuit board producing speed can be improved.

Furthermore, according to this embodiment, this system has the holder carrying conveyor which carries circuit boards on holders from the preheating unit to the temperature control unit which adjusts temperatures of both surfaces of circuit boards via the flow-soldering unit, provides stations in the entrance and exit of the holder carrying conveyor where the circuit boards on the holders can be caused to stop, allows to set an optimum conveyor velocity under which circuit boards are carried after starting the holders from the entrance until the flow-solder is completed, allows to set an optimum preheating time also, and enables a continuous flow-soldering of circuit boards the optimum conveyor carrying velocities and optimum preheating times of which differ within one system.

Further, according to this embodiment, a time required for ceasing circuit board productions due to changes of flow-soldering conditions can be reduced by dividing the circuit board carrying conveyor into a section which is involved in soldering, a section in which flux is applied, and a section for other workings, and by controlling each conveyor independently, particularly when producing many different type circuit boards in small quantities.

As described above, according to the present invention, in a packaging method using lead-free solder, effects to prevent a faulty soldering which may occur from a lead-free soldering and to connect not only insertion mount devices but also surface mount devices can be taken with a high reliability maintained.

Further, according to the present invention, in the packaging method using lead-free solder, allowable temperature range of molten solder jet can be expanded to a high temperature side when making a flow-soldering, and therefore, such an effect as to easily control temperatures can be taken.

What is claimed is:

1. A mixed packaging method using lead-free solder comprising:
   a reflow-soldering step of reflow-soldering a surface mount device to an upper surface and/or a lower surface of a circuit board with a lead-free solder paste;
   an inserting step of inserting a lead or a terminal of an insertion mount device into a through hole drilled in said circuit board from an upper surface side of said circuit board;
   a flux applying step of applying flux to said circuit board after the lead or the terminal of said insertion mount device is inserted into the through hole in said inserting step;
   a preheating step of preheating the lower surface of said circuit board by a preheating system in order to shorten a time required for connecting the lead or the terminal of said insertion mount device to the circuit board in a flow-soldering step after the flux is applied to said circuit board in said flux applying step;
   the flow-soldering step including flow-soldering the lead or the terminal of said insertion mount device to the circuit board by applying a lead-free solder jet to the lower surface of said circuit board, which had been preheated in said preheating step, the lead-free solder jet being applied while cooling the upper surface of said circuit board with a board cooling system which blows fluid having a temperature not more than 50° C. in order to prevent a peel off effect that would result from re-melting of a portion of the solder paste connecting the surface mount device to the upper surface and/or the lower surface of the circuit board, a temperature of said lead-free solder jet applied to the lower surface of said circuit board being within a range of 170° C. to 260° C.; and
   a circuit board-double-side temperature control step of cooling the upper surface and the lower surface of said circuit board, immediately after the soldering in said flow-soldering step.

2. The mixed packaging method using lead-free solder according to claim 1, further comprising the step of attaching, before said flux applying step, a cover on a portion where said surface mount device have already been mounted to the lower surface of said circuit board.

3. The mixed packaging method using lead-free solder according to claim 1, wherein in said flow-soldering step said lead-free solder is an eutectic crystal composition or a composition similar to the eutectic crystal composition of Sn—Cu system, Sn—Ag system, Sn—Zn system, Sn—Ag—Cu system, Sn—Zn—Cu system, Sn—Ag—Bi system or Sn—Zn—Bi system.

4. The mixed packaging method using lead-free solder according to claim 1, wherein in said reflow-soldering step said lead-free solder paste is a solder alloy of Sn—Cu system, Sn—Ag system, Sn—Zn system, Sn—Ag—Cu system, Sn—Zn—Cu system, Sn—Ag—Bi system or Sn—Zn—Bi system.

5. The mixed packaging method using lead-free solder according to claim 1, wherein in said reflow-soldering step said lead-free solder paste is a solder alloy of Sn-(1~4)Ag-(0~8)Bi-(0~1)Cu (unit: Mass %).

6. The mixed packaging method using lead-free solder according to claim 1, wherein in said flow-soldering step said fluid is formed by nitrogen or the like.

7. The mixed packaging method using lead-free solder according to claim 1, wherein in said flow-soldering step the temperature of said fluid is not less than 20° C.

8. A mixed packaging structure comprising:
   the surface mount device and the insertion mount device are packaged on the circuit board by using a packaging method using lead-free solder according to claim 1.

9. A mixed packaging method using lead-free solder comprising:
   a reflow-soldering step of reflow-soldering a surface mount device to an upper surface and/or a lower surface of a circuit board with a lead-free solder paste;
   an inserting step of inserting a lead or a terminal of an insertion mount device into a through hole drilled in said circuit board from an upper surface side of said circuit board;
   a warp preventing jig attaching step of attaching a warp preventing jig on said circuit board;
   a flux applying step of applying flux to said circuit board after the lead or the terminal of said insertion mount device is inserted into the through hole in said inserting step;
   a preheating step of preheating the lower surface of said circuit board by a preheating system in order to shorten a time required for connecting the lead or the terminal of said insertion mount device to the circuit board in a flow-soldering step after the flux is applied to said circuit board in said flux applying step;
   the flow-soldering step including flow-soldering the lead or the terminal of said insertion mount device to said circuit board by applying a lead-free solder jet to the lower surface of said circuit board, which had been preheated in said preheating step, the lead-free solder jet being applied while heating the upper surface of said circuit board, which is attached to the warp preventing jig, by a board heating system which blows fluid having a temperature not less than 100° C., thereby preventing a peel off of the surface mount device due to segregation of a component having a low melting point that is contained in the solder paste, a temperature of said lead-free solder jet applied to the lower surface of said circuit board being within a range of 170° C. to 260° C.; and
   a circuit board-double-side temperature control step of cooling the upper surface and the lower surface of said circuit board, immediately after the soldering in said flow-soldering step.

10. The mixed packaging method using lead-free solder according to claim 9, further comprising the step of attaching, before said flux applying step, a cover on a portion where said surface mount device have already been mounted to the lower surface of said circuit board.

11. The mixed packaging method using lead-free solder according to claim 9, wherein in said flow-soldering step said lead-free solder is an eutectic crystal composition or a composition similar to the eutectic crystal composition of Sn—Cu system, Sn—Ag system, Sn—Zn system, Sn—Ag—Cu system, Sn—Zn—Cu system, Sn—Ag—Bi system or Sn—Zn—Bi system.

12. The mixed packaging method using lead-free solder according to claim 9, wherein in said reflow-soldering step said lead-free solder paste is a solder alloy of Sn—Cu system, Sn—Ag system, Sn—Zn system, Sn—Ag—Cu system, Sn—Zn—Cu system, Sn—Ag—Bi system or Sn—Zn—Bi system.

13. The mixed packaging method using lead-free solder according to claim 9, wherein in said reflow-soldering step said lead-free solder paste is a solder alloy of Sn-(1~4)Ag-(0~8)Bi-(0~1)Cu (unit: Mass %).

14. The mixed packaging method using lead-free solder according to claim 9, wherein in said flow-soldering step said fluid is formed by nitrogen or the like.

15. The mixed packaging method using lead-free solder according to claim 9, wherein in said flow-soldering step the temperature of said fluid is in a range of 150° C. to 200° C.

16. The mixed packaging method using lead-free solder according to claim 9, wherein in said circuit board-double-side temperature control step the upper surface of the circuit board is cooled after slightly being heated so as to prevent an occurrence of a great temperature gradient between the lower surface and the upper surface of the circuit board immediately after the flow-soldering step.

17. A mixed packaging structure comprising: the surface mount device and the insertion mount device are packaged on the circuit board by using a packaging method using lead-free solder according to claim 9.

* * * * *